United States Patent
Mandal et al.

(10) Patent No.: US 8,248,283 B2
(45) Date of Patent: Aug. 21, 2012

(54) MULTI-CHANNEL SAR ADC

(75) Inventors: Dipankar Mandal, Bangalore (IN); Kiran M. Godbole, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 112 days.

(21) Appl. No.: 12/858,026

(22) Filed: Aug. 17, 2010

(65) Prior Publication Data
US 2011/0304492 A1 Dec. 15, 2011

(30) Foreign Application Priority Data
Jun. 11, 2010 (IN) ............................ 1623/CHE/2010

(51) Int. Cl.
*H03M 1/00* (2006.01)
(52) U.S. Cl. ...................... 341/141; 341/144; 341/172
(58) Field of Classification Search .................. 341/144, 341/141, 146, 172, 150, 159; 327/94
See application file for complete search history.

(56) References Cited

U.S. PATENT DOCUMENTS

| | | | |
|---|---|---|---|
| 3,700,871 A | 10/1972 | Montgomery et al. | |
| 5,084,634 A | 1/1992 | Gorecki | |
| 5,638,072 A | 6/1997 | Van Auken et al. | |
| 6,052,000 A * | 4/2000 | Nagaraj | 327/94 |
| 6,265,911 B1 | 7/2001 | Nairm | |
| 6,281,831 B1 | 8/2001 | Shou et al. | |
| 6,525,574 B1 | 2/2003 | Herrera | |
| 6,552,592 B1 | 4/2003 | Kuttner | |
| 7,453,291 B2 | 11/2008 | Song | |
| 2002/0140594 A1 | 10/2002 | Seymour | |

* cited by examiner

*Primary Examiner* — Jean B Jeanglaude
(74) *Attorney, Agent, or Firm* — John J. Patti; Wade J. Brady, III; Frederick J. Telecky, Jr.

(57) ABSTRACT

For high voltage applications, multi-channel successive approximation register (SAR) analog-to-digital converters (ADCs) are often plagued with numerous problems that are generally associated with parasitics (which are present in high voltage components). Here, a different architecture is provided where the sampling capacitors are separated from conversion capacitors so as to have low voltage components in the conversion path. Additionally, to improve the acquisition time and reduced total harmonic distortion (THD) multiple channels can use the same sampling capacitors.

10 Claims, 2 Drawing Sheets

US 8,248,283 B2

MULTI-CHANNEL SAR ADC

CROSS-REFERENCE TO RELATED APPLICATIONS

This application is claims priority from Indian Patent Application No. 1623/CHE/2010, filed Jun. 11, 2010, which is hereby incorporated by reference for all purposes.

TECHNICAL FIELD

The invention relates generally to analog-to-digital converters (ADCs) and, more particularly, to multi-channel successive approximation register (SAR) ADCs.

BACKGROUND

Referring to FIG. 1 of the drawings, the reference numeral 100 generally designates a conventional, multi-channel SAR ADC. ADC 100 generally comprises a multiplexer 102, a SAR ADC 104, and a controller 106. SAR DAC 104 generally comprises a sample-and-hold circuit 112, a capacitive digital-to-analog converter (CDAC), a comparator or comparison circuit 110, SAR logic 112, and a controller 106.

In operation, the ADC 100 operates to receive analog signals from several channels CH1 to CHn and to convert the analog signals to a digital signal DOUT. The controller 106, which is in communication with ADC 104, provides a selection signal to multiplexer 102 so as to provide channel selection. The analog signal output from the multiplexer 102 is sampled by the S/H circuit 112 and converted to the digital signal DOUT with the CDAC 108, comparator 110, and SAR logic 112 using a successive approximation algorithm.

There are numerous problems with this type of architecture. For example, if the S/H circuit 112 corresponding to each individual channel has large parasitics, which is present in high voltage MOS process technologies will cause very large parasitics when all the channel are connected to a common sampling capacitor. This causes the sampling time to be high, resulting in poor total harmonic distortion (THD) due to the nonlinearity of the parasitic capacitance. Thus, there is a need for an improved multi-channel SAR ADC that generally avoids the parasitics of high voltage MOS process technologies.

Some examples of conventional circuits are: U.S. Patent Pre-Grant Publ. No. 2002/0140594; U.S. Pat. No. 3,700,871; U.S. Pat. No. 5,084,634; U.S. Pat. No. 6,552,592; U.S. Pat. No. 7,453,291; U.S. Pat. No. 6,525,574; U.S. Pat. No. 6,265,911; U.S. Pat. No. 5,638,072; U.S. Pat. No. 6,281,831.

SUMMARY

A preferred embodiment of the present invention, accordingly, provides an apparatus. The apparatus comprises a multiplexer having: a plurality of input terminals; an output terminal; a plurality of selection switches, wherein each selection switch is coupled to at least one of the input terminals of the multiplexer; a plurality of boost circuit, wherein each boost circuit is coupled in parallel to at least one of the selection switches; a plurality of sample-and-hold (S/H) circuits, wherein each S/H is coupled to at least two of the selection switches, and wherein each S/H circuit is coupled to the output terminal of the multiplexer; a capacitive digital-to-analog converter (CDAC) that is coupled to the output terminal of the multiplexer; a caparison circuit that is coupled to the CDAC; successive approximation register (SAR) logic that is coupled to the comparison circuit and the CDAC, wherein the SAR logic control switching of the CDAC; and a controller that is coupled to the multiplexer so as to perform channel selection for the multiplexer.

In accordance with a preferred embodiment of the present invention, each boost circuit further comprises: a boosted switch that is coupled in parallel to its selection switch; a first switch that is coupled to a first voltage rail; a boost capacitor that is coupled to the first switch; a second switch that is coupled between the boost capacitor and the boosted switch; and a third switch that is coupled between the boost capacitor and a second voltage rail.

In accordance with a preferred embodiment of the present invention, each boosted switch further comprises a control electrode, and wherein each boost circuit further comprises: a fourth switch that is coupled between the first switch and the control electrode of the boost switch; and a fifth switch that is coupled between the control electrode of the boosted switch and the second voltage rail.

In accordance with a preferred embodiment of the present invention, each S/H circuit further comprises a plurality of branches coupled in parallel with one another, wherein each branch includes: a sampling capacitor; a first sampling switch coupled in series between the sampling capacitor and the output terminal of the multiplexer; and a second sampling switch that is coupled between the sampling capacitor and a third voltage rail.

In accordance with a preferred embodiment of the present invention, each selection switch is a CMOS switch.

In accordance with a preferred embodiment of the present invention, an apparatus is provided. The apparatus comprises a multiplexer having: a first input terminal; a first selection switch that is coupled to the first input terminal; a first boost circuit that is coupled to the first input terminal; a second input terminal; a second selection switch that is coupled to the second input terminal; a second boost circuit that is coupled to the second input terminal; a third input terminal; a third selection switch that is coupled to the third input terminal; a third boost circuit that is coupled to the third input terminal; a fourth input terminal; a fourth selection switch that is coupled to the fourth input terminal; a fourth boost circuit that is coupled to the fourth input terminal; a first S/H circuit that is coupled to the first selection switch, the first boost circuit, the second selection switch, and the second boost circuit; a second S/H circuit that is coupled to the third selection switch, the third boost circuit, the fourth selection switch, and the fourth boost circuit; and an output terminal that is coupled to the first and second S/H switches; a capacitive digital-to-analog converter (CDAC) that is coupled to the output terminal of the multiplexer; a caparison circuit that is coupled to the CDAC; and SAR logic that is coupled to the comparison circuit and the CDAC, wherein the SAR logic control switching of the CDAC; and a controller that is coupled to the multiplexer so as to perform channel selection for the multiplexer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
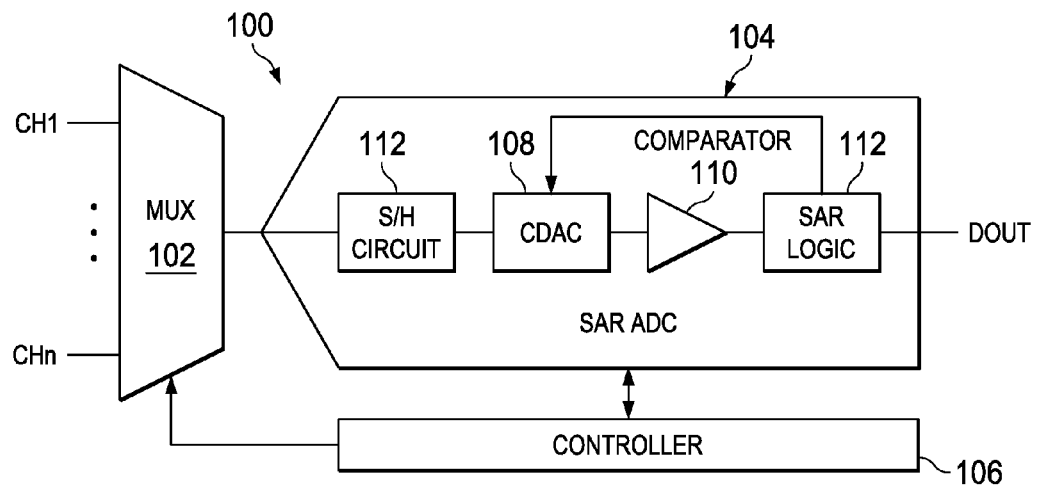
FIG. 1 is a block diagram of a conventional multi-channel SAR ADC.

Refer now to the drawings wherein depicted elements are, for the sake of clarity, not necessarily shown to scale and wherein like or similar elements are designated by the same reference numeral through the several views.

Figure 2:
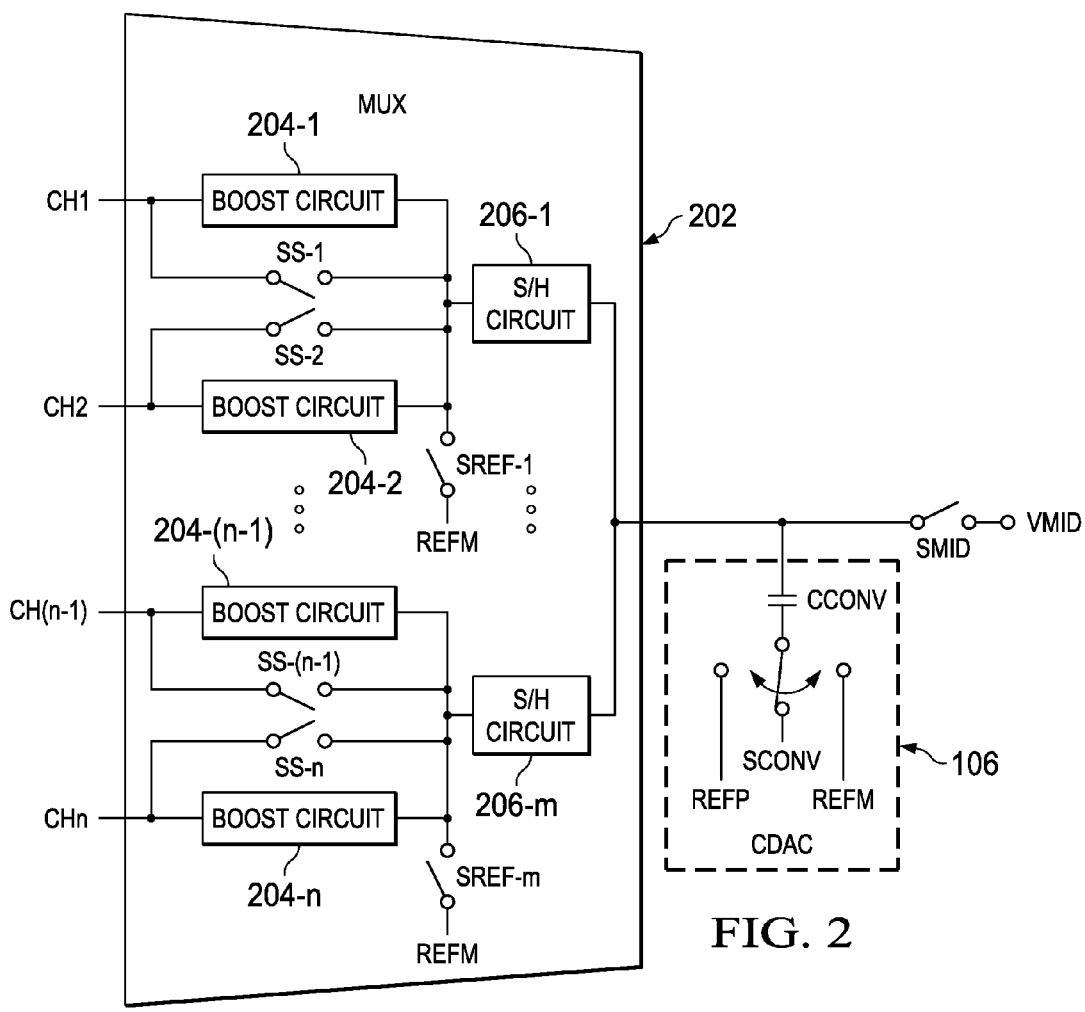
FIG. 2 is a block diagram of an example of configuration for a multiplexer, S/H circuit, and CDAC for multi-channel SAR ADC in accordance with a preferred embodiment of the present invention.

Turning to FIG. 2 of the drawings, a portion of a multi-channel SAR ADC in accordance with a preferred embodiment of the present invention can be seen. In this configuration, S/H circuits 206-1 to 206-m have been incorporated into multiplexer or mux 202, and each S/H circuit 206-1 to 206-m (and its corresponding pulldown switch SREF-1 to SREF-m) is associated with a pair of input channels CH1 to CHn. However, depending on process technology, each S/H circuit 206-1 to 206-m can be associated to 2 or more input channels. For each channel CH1 to CHn, there is a selection switch SS-1 to SS-n (which are each generally high voltage CMOS switches and which are each generally coupled to an input terminal of mux 202) and a boost circuit 204-1 to 204-n (which is generally coupled in parallel to its associated selection switch SS-1 to SS-n). An example of this configuration would be an 8 channel multiplexer with 4 S/H circuits. This multiplexer 202 is then coupled to CDAC 106 (which is represented by conversion capacitor CCONV and by conversion switch SCONV that receives reference voltages REFP and REFM) that uses a SAR algorithm. Additionally, multiplexer 202 is coupled to switch SMID, which receives a middle voltage VMID.

Figure 3:
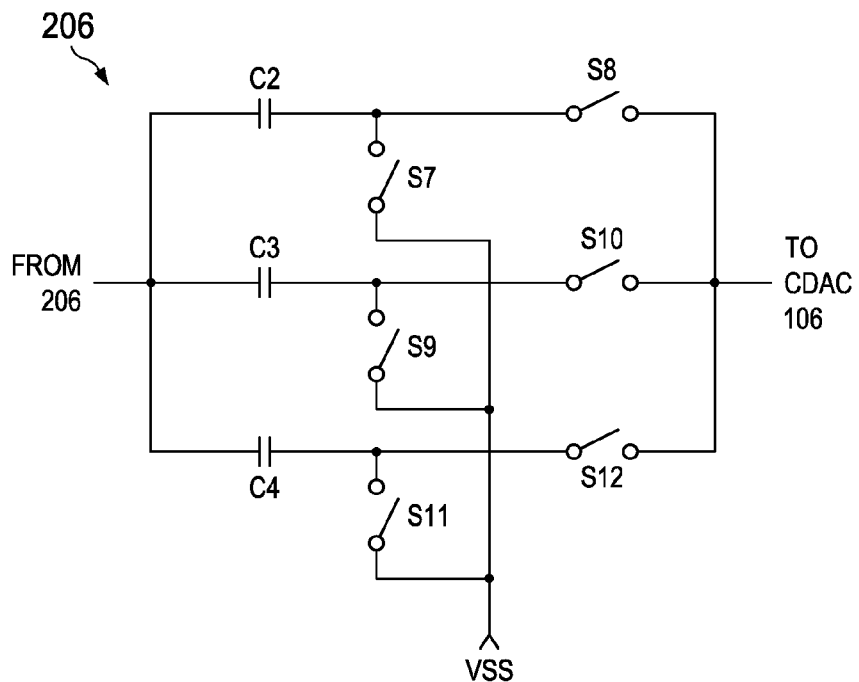
FIG. 3 is a circuit diagram of an example of a S/H circuit of FIG. 2.

Looking to FIG. 3, S/H circuit 204-1 to 204-n (hereinafter referred to as 204) can be seen in greater detail. S/H circuit 204 is generally comprised of several branches that are coupled in parallel with one another where the number of branches and capacitive values for each branch can be selected for a desired level scaling. Here, for example, three branches are shown with each branch including a capacitor C2, C3, or C4 and switches S7/S8, S9/S10, or S11/S12 (which are generally low voltage switches). As an example, an input signal level can vary between about 5V (±about 2.5V) to about 20V (±about 10V) with an offset between about 0V and about 5V, and a reference voltage of about 2.5V. For this example, the total capacitance of the CDAC 106 can be selected to be about 32*CS, where CS is a unit capacitance, and the total capacitance for the S/H circuit 204 can be selected to be about 16CS with capacitors C2, C3, and C4 having capacitances of 4*CS, 4*CS, and 8*CS, respectively. That way, different combinations of capacitors C2, C3, and C4 can support 20V, 10V, and 5V input ranges, respectively, with offset compensation occurring within the CDAC 106. Thus, based on the input voltage range, switch S2, S10, or S11 can be activated for the desired branch, while switch S7, S8, or S9 (for the remaining branches) couple their respective capacitors C2, C3, or C4 to a voltage rail (i.e., ground or VSS).

Figure 4:
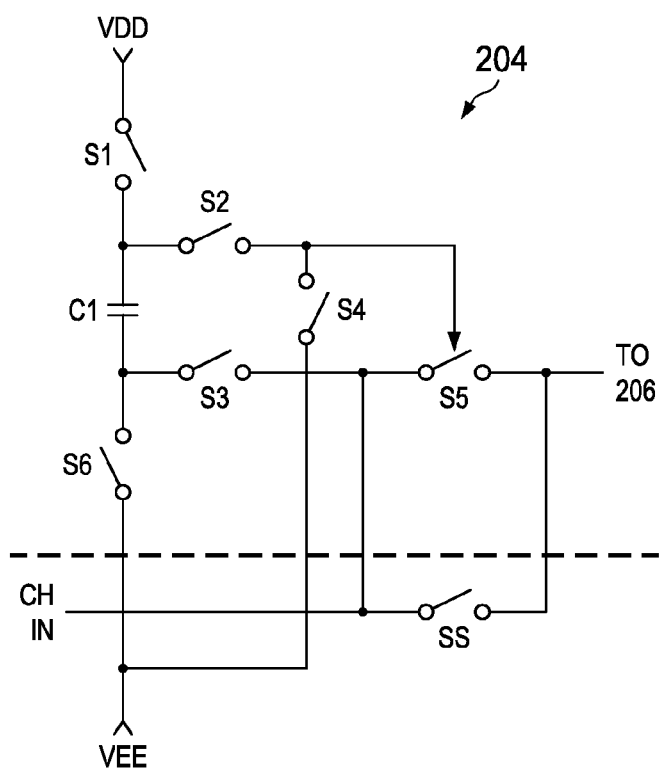
FIG. 4 is a circuit diagram of an example of the boost circuit of FIG. 2.

To help compensate for parasitics within switches SS-1 to SS-n (hereinafter referred to as SS), boost circuits 204-1 to 204-m (hereinafter referred to as 204) are used, which can be seen in greater detail in FIG. 4. To accomplish this, an input dependent boosted switch S5 (which is generally a high voltage NMOS transistor) is coupled in parallel to CMOS selection switch SS. This helps to make switch SS very small in size (which means low parasitics for the switch SS), and switch S5 can provide a highly linear sampling path to S/H circuit 206. Additionally, boost circuit 204 also generally comprises boost capacitor C1, and switches S1 to S4 and S6.

In operation, both signal dependent boost switch S5 and signal independent CMOS switch SS are employed. Switch SS is a small CMOS switch to support infinite time for sampling as the coupling capacitor C1 to switch S5 may lose the charge for a very long sampling duration. During non-sampling time, switch S1, S6 and S4 are closed, and switches S2, S3, S5 and SS are open. This causes the capacitor C1 to be charged to a fixed DC voltage (for example, VDD-VEE). Additionally, closed switch S4 maintains at the high voltage NMOS switch S5 in an "off" state during the non-sampling time. During sampling time, switch S1, S6 and S4 are open, and switches S2, S3, S5 and SS are closed. Closed switch S2 and S3 apply an input dependent boost voltage (for example, input votlage+VDD-VEE) at the gate of NMOS switch S5. Input dependent boosting of switch S5 also helps to provide linear resistance for switch S5 over all input ranges. Also, during sampling time, switch SS also remain closed to support infinite sampling time duration.

As a result of implementing this configuration, several advantages can, therefore, be realized. For example, this configuration allows for better total harmonic distortion (THD) with a lower sampling time for all ranges with multiple channels associated with it. Also, this implementation separates the path of the reference voltages REFP/REFM to the conversion capacitor CCONV from sampling capacitor (within S/H circuits 206-1 to 206-m) which enables to use high speed low voltage switch for the reference voltage REFP/REFM selection in conversion capacitor CCONV. Additionally, this configuration does not generally degrade the signal-to-noise ratio (SNR) as compared to other conventional configurations. Moreover, because switches S7 through S12 are low voltage switches, the conversion time can be improved.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a multiplexer having:
   a plurality of input terminals;
   an output terminal;
   a plurality of selection switches, wherein each selection switch is coupled to at least one of the input terminals of the multiplexer;
   a plurality of boost circuit, wherein each boost circuit is coupled in parallel to at least one of the selection switches;

a plurality of sample-and-hold (S/H) circuits, wherein each S/H is coupled to at least two of the selection switches, and wherein each S/H circuit is coupled to the output terminal of the multiplexer;
a capacitive digital-to-analog converter (CDAC) that is coupled to the output terminal of the multiplexer;
a comparison circuit that is coupled to the CDAC;
successive approximation register (SAR) logic that is coupled to the comparison circuit and the CDAC, wherein the SAR logic control switching of the CDAC; and
a controller that is coupled to the multiplexer so as to perform channel selection for the multiplexer.

2. The apparatus of claim 1, wherein each boost circuit further comprises:
a boosted switch that is coupled in parallel to its selection switch;
a first switch that is coupled to a first voltage rail;
a boost capacitor that is coupled to the first switch;
a second switch that is coupled between the boost capacitor and the boosted switch; and
a third switch that is coupled between the boost capacitor and a second voltage rail.

3. The apparatus of claim 2, wherein each boosted switch further comprises a control electrode, and wherein each boost circuit further comprises:
a fourth switch that is coupled between the first switch and the control electrode of the boost switch; and
a fifth switch that is coupled between the control electrode of the boosted switch and the second voltage rail.

4. The apparatus of claim 3, wherein each S/H circuit further comprises a plurality of branches coupled in parallel with one another, wherein each branch includes:
a sampling capacitor;
a first sampling switch coupled in series between the sampling capacitor and the output terminal of the multiplexer; and
a second sampling switch that is coupled between the sampling capacitor and a third voltage rail.

5. The apparatus of claim 4, wherein each selection switch is a CMOS switch.

6. An apparatus comprising:
a multiplexer having:
a first input terminal;
a first selection switch that is coupled to the first input terminal;
a first boost circuit that is coupled to the first input terminal;
a second input terminal;
a second selection switch that is coupled to the second input terminal;
a second boost circuit that is coupled to the second input terminal;
a third input terminal;
a third selection switch that is coupled to the third input terminal;
a third boost circuit that is coupled to the third input terminal;
a fourth input terminal;
a fourth selection switch that is coupled to the fourth input terminal;
a fourth boost circuit that is coupled to the fourth input terminal;
a first S/H circuit that is coupled to the first selection switch, the first boost circuit, the second selection switch, and the second boost circuit;
a second S/H circuit that is coupled to the third selection switch, the third boost circuit, the fourth selection switch, and the fourth boost circuit; and
an output terminal that is coupled to the first and second S/H switches;
a capacitive digital-to-analog converter (CDAC) that is coupled to the output terminal of the multiplexer;
a comparison circuit that is coupled to the CDAC; and
SAR logic that is coupled to the comparison circuit and the CDAC, wherein the SAR logic control switching of the CDAC; and
a controller that is coupled to the multiplexer so as to perform channel selection for the multiplexer.

7. The apparatus of claim 6, wherein each of the first, second, third, and fourth boost circuits further comprises:
a boosted switch that is coupled in parallel to its selection switch;
a first switch that is coupled to a first voltage rail;
a boost capacitor that is coupled to the first switch;
a second switch that is coupled between the boost capacitor and the boosted switch; and
a third switch that is coupled between the boost capacitor and a second voltage rail.

8. The apparatus of claim 7, wherein each boosted switch further comprises a control electrode, and wherein each of the first, second, third, and fourth boost circuit further comprises:
a fourth switch that is coupled between the first switch and the control electrode of the boosted switch; and
a fifth switch that is coupled between the control electrode of the boosted switch and the second voltage rail.

9. The apparatus of claim 8, wherein each S/H circuit further comprises a plurality of branches coupled in parallel with one another, wherein each branch includes:
a sampling capacitor;
a first sampling switch coupled in series between the sampling capacitor and the output terminal of the multiplexer; and
a second sampling switch that is coupled between the sampling capacitor and a third voltage rail.

10. The apparatus of claim 9, wherein each selection switch is a CMOS switch.

* * * * *